(12) United States Patent
Chang et al.

(10) Patent No.: US 9,305,638 B1
(45) Date of Patent: Apr. 5, 2016

(54) OPERATION METHOD FOR MEMORY DEVICE

(71) Applicant: MACRONIX INTERNATIONAL CO., LTD., Hsinchu (TW)

(72) Inventors: Yu-Ming Chang, Pingtung County (TW); Yung-Chun Li, New Taipei (TW); Chih-Chang Hsieh, Hsinchu (TW); Shih-Fu Huang, Zhongli (TW); Hsiang-Pang Li, Zhubei (TW); Yuan-Hao Chang, Taipai (TW); Tei-Wei Kuo, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/526,560

(22) Filed: Oct. 29, 2014

(51) Int. Cl.
  *G11C 16/04* (2006.01)
  *G11C 11/56* (2006.01)
  *G11C 16/34* (2006.01)

(52) U.S. Cl.
  CPC ........ *G11C 11/5628* (2013.01); *G11C 11/5642* (2013.01); *G11C 16/3427* (2013.01); *G11C 16/3459* (2013.01)

(58) Field of Classification Search
  CPC ........... G11C 16/3418; G11C 16/0483; G11C 16/10; G11C 16/30
  USPC ........................... 365/185.02, 185.18, 185.22
  See application file for complete search history.

(56) References Cited

U.S. PATENT DOCUMENTS 7,085,161 B2 * 8/2006 Chen .................. G06F 11/1068
  365/185.02

* cited by examiner

*Primary Examiner* — Huan Hoang
(74) *Attorney, Agent, or Firm* — McClure, Qualey & Rodack, LLP

(57) ABSTRACT

Operation methods for a memory device is provided. An operation method for the memory device comprises programming the memory device as described in follows. Data are provided. The data comprise a plurality of codes. Each number of the codes is counted. Then, a mapping rule is generated according to each number of the codes. In the mapping rule, each of the codes is mapped to one of a plurality of verifying voltage levels which are sequentially arranged from low to high. After that, the data are programmed into the memory device according to the mapping rule.

11 Claims, 10 Drawing Sheets

OPERATION METHOD FOR MEMORY DEVICE

BACKGROUND

1. Technical Field

The disclosure relates to an operation method for a memory device, particularly to the programming of the memory device.

2. Description of the Related Art

Various methods can be used to programming a memory device. One approach is incremental step pulse programming (ISPP). In an ISPP process, memory cells are programmed toward the state with higher threshold voltage $V_t$ by means of gradually adding a small fixed voltage $\Delta V_{ISPP}$ to the previous program voltage $V_{pgm}$. During such a process, memory cells disposed near programmed cells may also be affected. This effect is called program disturbance. If the programmed cells are "slow cells", i.e., the memory cells which needs more program pulse than others, the program disturbance effect may be more critical.

SUMMARY

In this disclosure, an operation method for a memory device is provided to reduce the program disturbance.

According to some embodiment, an operation method for a memory device is provided. The operation method comprises programming the memory device as described in follows. At first, a plurality of data are provided to a controller. The data comprise a plurality of codes. Each number of the codes is counted by the controller. Then, a mapping rule is generated according to each number of the codes by the controller. In the mapping rule, each of the codes is mapped to one of a plurality of verifying voltage levels which are sequentially arranged from low to high. After that, the data are programmed into a memory array of the memory device according to the mapping rule.

According to some embodiment, an operation method for a memory device is provided. The operation method comprises programming the memory device as described in follows. A plurality of first programmed page bits of a plurality of data are provided, wherein the first programmed page bits comprise a code 0 and a code 1. Each number of the code 0 and the code 1 in the first programmed page bits is counted by the controller. A first mapping rule is generated according to each number of the code 0 and the code 1 in the first programmed page bits by the controller. Then, the first programmed page bits are programmed into a first programmed page of the memory device according to the first mapping rule. A plurality of second programmed page bits of the plurality data are provided, wherein the second programmed page bits comprise a code 0 and a code 1. Under each of the code 0 and the code 1 in the first programmed page bits, each number of the code 0 and the code 1 in the second programmed page bits is counted by the controller. A second mapping rule is generated according to each number of the code 0 and the code 1 in the second programmed page bits by the controller. Then, the second programmed page bits are programmed into a second programmed page of the memory device according to the second mapping rule. A plurality of third programmed page bits of the plurality data are provided, wherein the third programmed page bits comprise a code 0 and a code 1. Under each of the code 0 and the code 1 in the first programmed page bits and each of the code 0 and the code 1 in the second programmed page bits, each number of the code 0 and the code 1 in the third programmed page bits is counted by the controller. A third mapping rule is generated according to each number of the code 0 and the code 1 in the third programmed page bits by the controller. Then, the third programmed page bits are programmed into a third programmed page of the memory device according to the third mapping rule.

Figure 1:
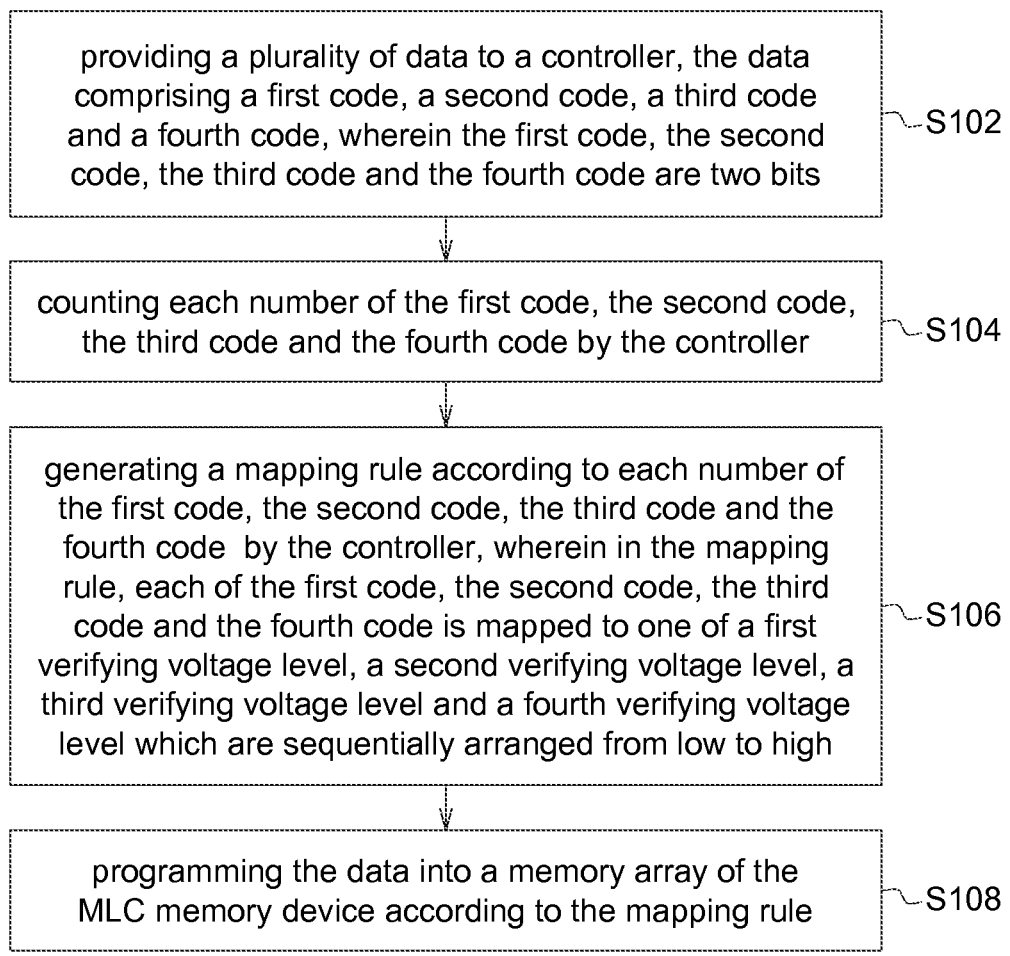
FIG. 1 is a flow chart of a programming process of an operation method for a multi-level-cell (MLC) memory device according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

According to one embodiment, an operation method for a MLC memory device is provided. FIG. 1 is a flow chart of a program process of the operation method for a MLC memory device according to the embodiment.

At first, at step S102, a plurality of data are provided to a controller. The data comprise a first code, a second code, a third code and a fourth code. The first code, the second code, the third code and the fourth code are two bits. For example, each of the first code, the second code, the third code and the fourth code may be one of the codes 00, 01, 10 and 11.

Then, at step S104, each number of the first code, the second code, the third code and the fourth code is counted by the controller. At step S106, a mapping rule is generated according to each number of the first code, the second code, the third code and the fourth code by the controller. In the mapping rule, each of the first code, the second code, the third code and the fourth code is mapped to one of a first verifying voltage level, a second verifying voltage level, a third verifying voltage level and a fourth verifying voltage level which are sequentially arranged from low to high. For example, the first verifying voltage level is a erase verify level (EV), and the second verifying voltage level, the third verifying voltage level and the fourth verifying voltage level may be program verify levels (PV1, PV2, PV3). In one example, in the mapping rule, one of the first code, the second code, the third code and the fourth code whose number is largest is mapped to the first verifying voltage level. In another example, in the mapping rule, one of the first code, the second code, the third code and the fourth code whose number is largest is mapped to the second verifying voltage level. The mapping rule may be stored in the MLC memory device or an external memory. Since there are 24 kinds of the mapping rule, only five bit (smaller than one byte) is needed to store what kind of the mapping rule is used.

After that, at step S108, the data are programmed into a memory array of the MLC memory device according to the mapping rule. Step S108 may comprise making a program command to a page buffer of the MLC memory device and programming the data from the page buffer to the memory array. In some example, before making the program command to the page buffer, an error correction code may be calculated.

In some example, before programming the data into the array of the MLC memory device (S108), the original data may be converted according the mapping rule. After the original data are converted, the data are programmed into the page buffer of the MLC memory device. The converting step may be carried out by the controller. Alternatively, the converting step may be implemented in a software management layer, such as a flash translation layer (FTL), or a flash file system.

Figure 2A:
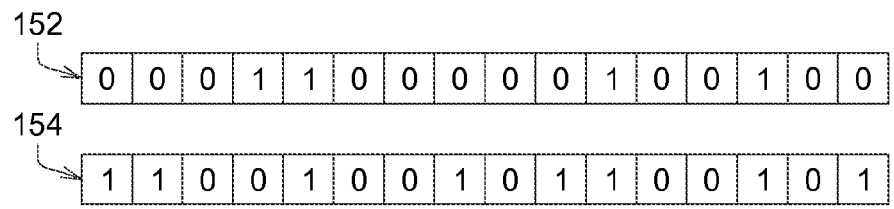
FIG. 2A-FIG. 2C schematically illustrate a programming process of an operation method for a MLC memory device.
Figure 2B:
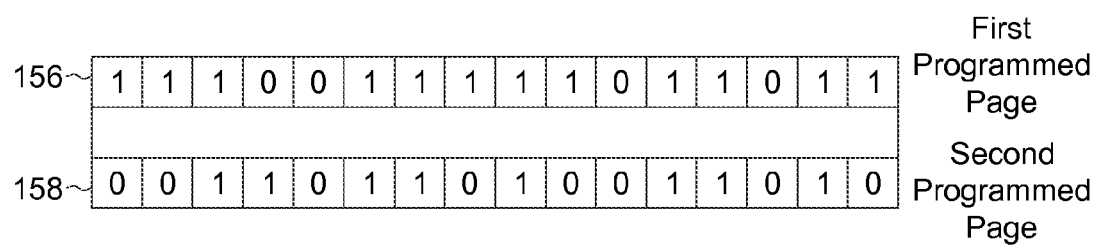
Figure 2C:
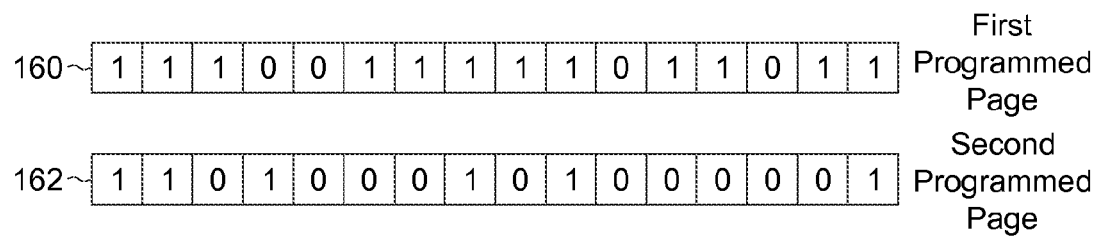

Now examples of the programming process of the operation method for a MLC memory device are given, as illustrated in FIG. 2A-FIG. 2C. As shown in FIG. 2A, sixteen data are provided to be programmed. The data comprise four kinds of codes 00, 01, 10 and 11. The data comprise first programmed page bits 152 to be programmed and second programmed page bits 154 to be programmed.

The numbers of the four codes 00, 01, 10 and 11 are counted. The result is that there are seven codes 00, five codes 01, one code 10, and three codes 11. In other words, the code sequence from the number being largest to the number being smallest is 00, 01, 11, 10.

Here, four verifying voltage levels are provided, comprising a first verifying voltage level, a second verifying voltage level, a third verifying voltage level and a fourth verifying voltage level. In the default mapping rule, the first verifying voltage level corresponds to the code 11, the second verifying voltage level corresponds to the code 10, the third verifying voltage level corresponds to the code 00, and the fourth verifying voltage level corresponds to the code 01.

In one example, since the code that the number is largest is the code 00, the code 00 is mapped to the first verifying voltage level. The codes 01, 11 and 10 are mapped to the second verifying voltage level, the third verifying voltage level and the fourth verifying voltage level, respectively. Then, the codes 00, 01, 11 and 10 may be converted to codes 11, 10, 00 and 01, and be programmed into the array of the MLC memory device. The programmed result is shown in FIG. 2B, in which the programmed first programmed page bits 156 and the programmed second programmed page bits 158 are different from the original first programmed page bits 152 to be programmed and the original second programmed page bits 154 to be programmed. In this example, the program disturbance may be reduced greatly. Further, the bit error rate may also be reduced.

In another example, the code that the number is largest, i.e., the code 00, is mapped to the second verifying voltage level. The codes 01, 11 and 10 are mapped to the first verifying voltage level, the third verifying voltage level and the fourth verifying voltage level, respectively. Then, the codes 00, 01, 11 and 10 may be converted to codes 10, 11, 00 and 01, and be programmed into the array of the MLC memory device. The programmed result is shown in FIG. 2C, in which the programmed first programmed page bits 160 and the programmed second programmed page bits 162 are different from the original first programmed page bits 152 to be programmed and the original second programmed page bits 154 to be programmed. In this example, the program disturbance may be reduced, and the bit error rate may be reduced greatly. The user may choose one of the mapping rules according to his or her needs.

Figure 3:
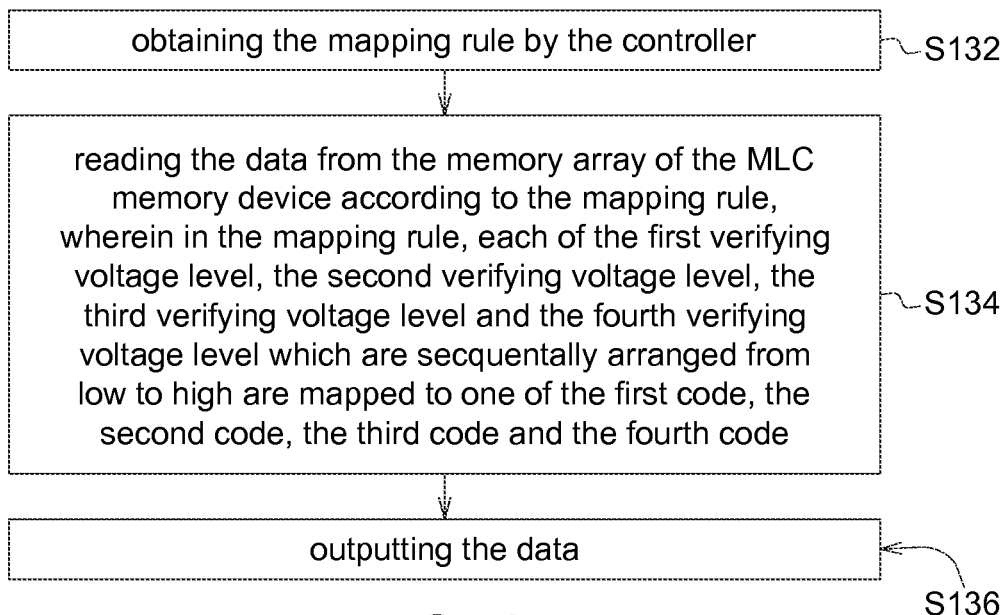
FIG. 3 is a flow chart of a read process of an operation method for a MLC memory device according to one embodiment.

FIG. 3 is a flow chart of a read process of the operation method for a MLC memory device according to the embodiment. At first, at step S132, the mapping rule is obtained by the controller. At step S134, the data are read from the memory array of the MLC memory device according to the mapping rule. In the mapping rule, each of the first verifying voltage level, the second verifying voltage level, the third verifying voltage level and the fourth verifying voltage level which are sequentially arranged from low to high are mapped to one of the first code, the second code, the third code and the fourth code. After that, at step S136, the data are outputted. In some example, before outputting the data, the data read from the memory array of the MLC memory device may be further converted by the controller, a flash translation layer or a flash file system.

Figure 4:
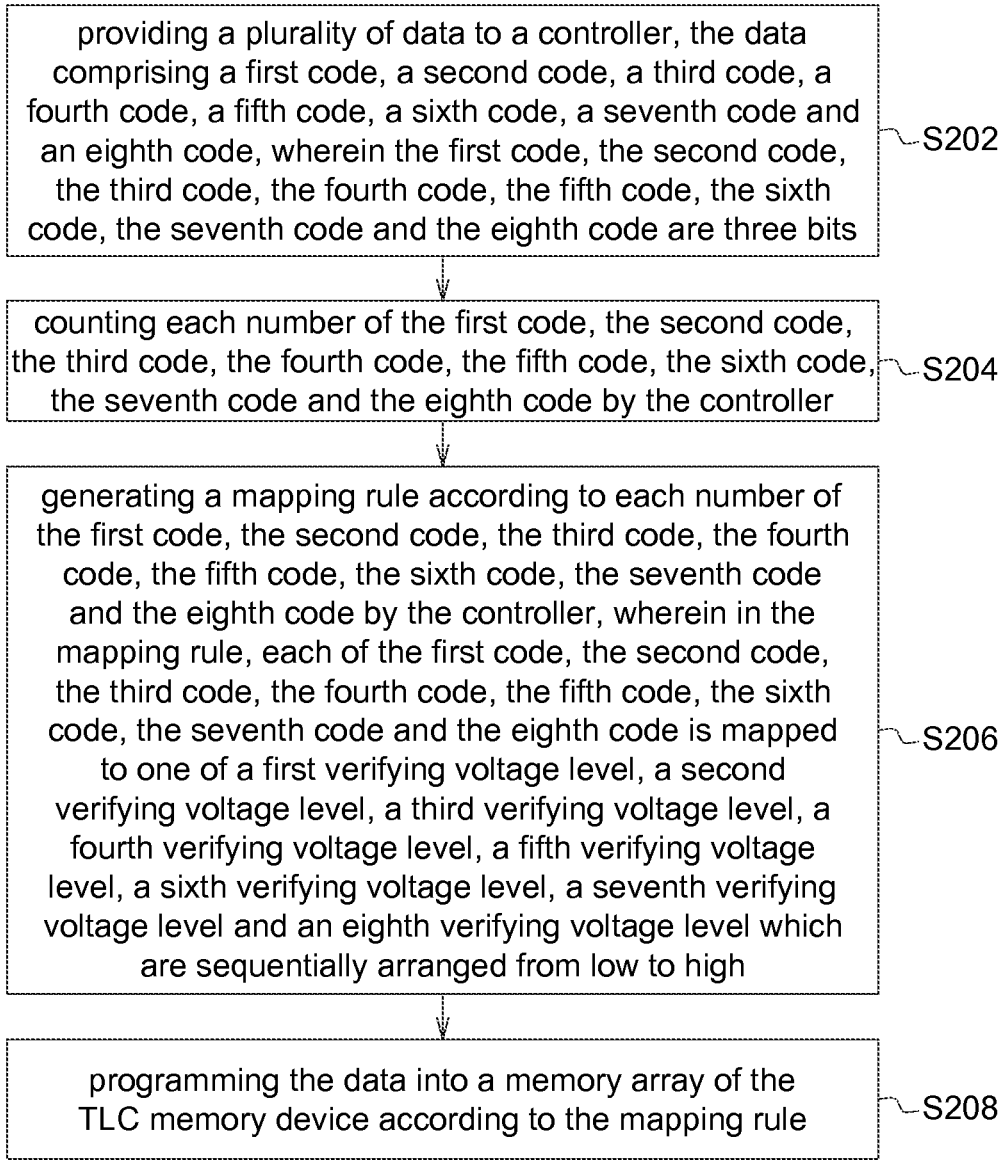
FIG. 4 is a flow chart of a programming process of an operation method for a triple-level-cell (TLC) memory device according to one embodiment.

Now, according to one embodiment, an operation method for a TLC memory device is provided. FIG. 4 is a flow chart of a programming process of the operation method for a TLC memory device according to the embodiment.

At first, at step S202, a plurality of data are provided to a controller. The data comprise a first code, a second code, a third code, a fourth code, a fifth code, a sixth code, a seventh code and an eighth code. The first code, the second code, the third code, the fourth code, the fifth code, the sixth code, the seventh code and the eighth code are three bits. For example, each of the first code, the second code, the third code and the fourth code may be one of the codes 000, 001, 010, 011, 100, 101, 110 and 111.

Then, at step S204, each number of the first code, the second code, the third code, the fourth code, the fifth code, the sixth code, the seventh code and the eighth code is counted by the controller. At step S206, a mapping rule is generated according to each number of the first code, the second code, the third code, the fourth code, the fifth code, the sixth code, the seventh code and the eighth code by the controller. In the mapping rule, each of the first code, the second code, the third code, the fourth code, the fifth code, the sixth code, the seventh code and the eighth code is mapped to one of a first verifying voltage level, a second verifying voltage level, a third verifying voltage level, a fourth verifying voltage level, a fifth verifying voltage level, a sixth verifying voltage level, a seventh verifying voltage level and an eighth verifying voltage level which are sequentially arranged from low to high. For example, the first verifying voltage level is a erase verify level (EV), and the second verifying voltage level, the third verifying voltage level, the fourth verifying voltage level, the fifth verifying voltage level, the sixth verifying voltage level, the seventh verifying voltage level and the eighth verifying voltage level may be program verify levels (PV1, PV2, PV3, PV4, PV5, PV6, PV7). The mapping rule may be stored in the TLC memory device or an external memory. Since there are 40320 kinds of the mapping rule, only two byte is needed to store what kind of the mapping rule is used.

After that, at step S208, the data are programmed into a memory array of the TLC memory device according to the mapping rule. Step S208 may comprise making a program command to a page buffer of the TLC memory device and programming the data from the page buffer to the memory array. In some example, before making the program command to the page buffer, an error correction code may be calculated.

In some example, before programming the data into the array of the TLC memory device (S208), the original data may be converted according the mapping rule. After the original data are converted, the data are programmed into the page buffer of the TLC memory device. The converting step may be carried out by the controller. Alternatively, the converting step may be implemented in a software management layer, such as a flash translation layer, or a flash file system.

Figure 5A:
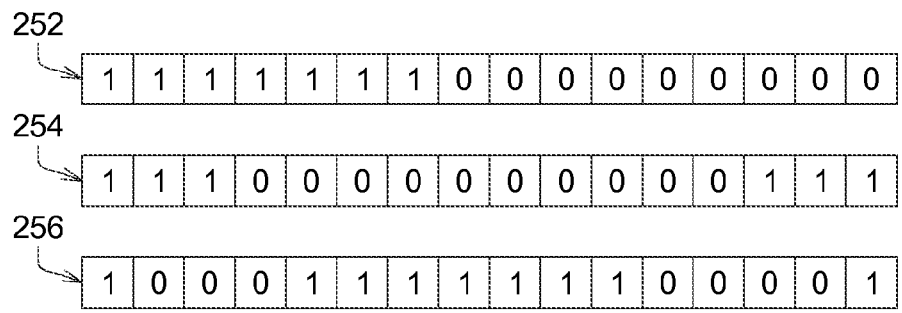
FIG. 5A-FIG. 5B schematically illustrate a programming process of an operation method for a TLC memory device.
Figure 5B:
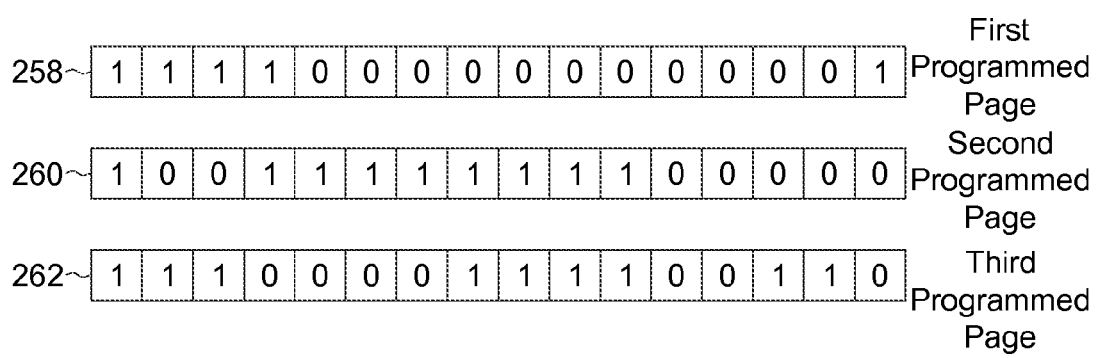

An example of the programming process of the operation method for the TLC memory device is given, as illustrated in FIG. 5A-FIG. 5B. As shown in FIG. 5A, sixteen data are provided to be programmed. The data comprise eight kinds of codes 000, 001, 010, 011, 100, 101, 110 and 111. The data comprise first programmed page bits 252 to be programmed, second programmed page bits 254 to be programmed, and third programmed page bits 256 to be programmed.

The numbers of the eight codes 000, 001, 010, 011, 100, 101, 110 and 111 are counted. The result is that there are two codes 000, four codes 001, two codes 010, one code 011, one code 100, three codes 101, two codes 110 and one code 111. In other words, the code sequence from the number being largest to the number being smallest is 001, 101, 000, 010, 110, 011, 100, 111.

Here, eight verifying voltage levels are provided, comprising a first verifying voltage level, a second verifying voltage level, a third verifying voltage level, a fourth verifying voltage level, a fifth verifying voltage level, a sixth verifying voltage level, a seventh verifying voltage level and an eighth verifying voltage level. In the default mapping rule, the first verifying voltage level corresponds to the code 011, the second verifying voltage level corresponds to the code 010, the third verifying voltage level corresponds to the code 000, the fourth verifying voltage level corresponds to the code 001, the fifth verifying voltage level corresponds to the code 101, the sixth verifying voltage level corresponds to the code 100, the seventh verifying voltage level corresponds to the code 110, and the eighth verifying voltage level corresponds to the code 111.

In one example, since the code that the number is largest is the code 001, the code 001 is mapped to the first verifying voltage level. The codes 101, 000, 010, 110, 011, 100 and 111 are mapped to the second verifying voltage level, the third verifying voltage level, the fourth verifying voltage level, the fifth verifying voltage level, the sixth verifying voltage level, the seventh verifying voltage level and the eighth verifying voltage level, respectively. Then, the codes 000, 001, 010, 011, 100, 101, 110 and 111 may be converted to codes 000, 011, 001, 100, 110, 010, 101 and 111, and be programmed into the array of the TLC memory device. The programmed result is shown in FIG. 5B, in which programmed first programmed page bits 258, the programmed second programmed page bits 260 and the programmed third programmed page bits 262 are different from the original first programmed page bits 252 to be programmed, the original second programmed page bits 254 to be programmed and the original third programmed page bits 256 to be programmed. The user may choose one mapping rule according to his or her needs.

Figure 6:
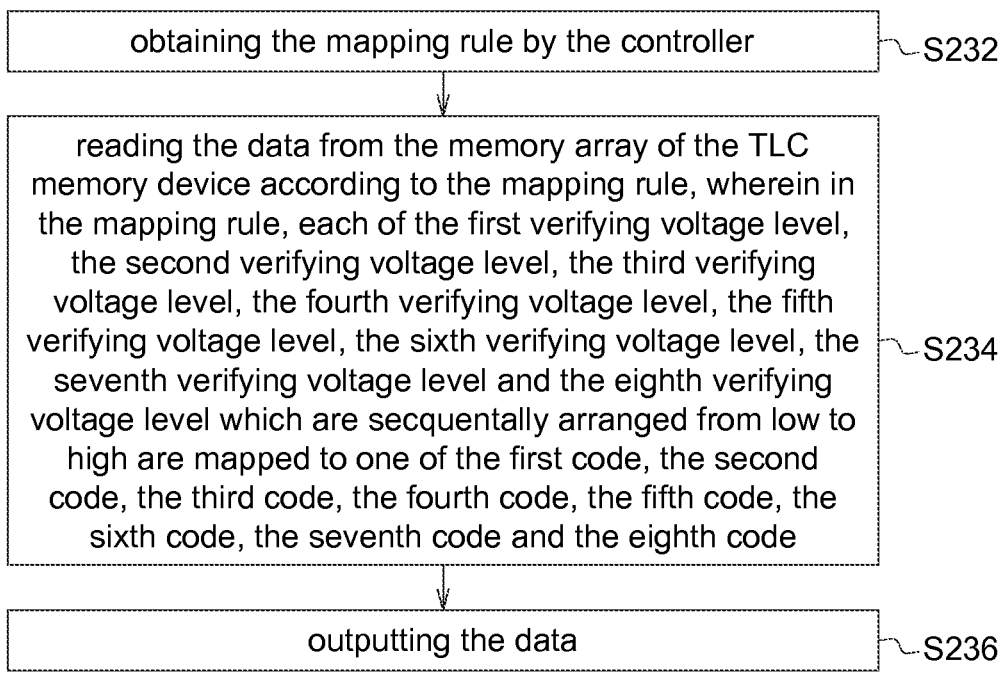
FIG. 6 is a flow chart of a read process of an operation method for a TLC memory device according to one embodiment.

FIG. 6 is a flow chart of a read process of the operation method for a TLC memory device according to the embodiment. At first, at step S232, the mapping rule is obtained by the controller. At step S234, the data are read from the memory array of the TLC memory device according to the mapping rule. In the mapping rule, each of the first verifying voltage level, the second verifying voltage level, the third verifying voltage level, the fourth verifying voltage level, the fifth verifying voltage level, the sixth verifying voltage level, the seventh verifying voltage level and the eighth verifying voltage level which are sequentially arranged from low to high are mapped to one of the first code, the second code, the third code, the fourth code, the fifth code, the sixth code, the seventh code and the eighth code. After that, at step S236, the data are outputted. In some example, before outputting the data, the data read from the memory array of the TLC memory device may be further converted by the controller, a flash translation layer or a flash file system.

In the above embodiments, the data are determined already. However, in some cases, the data may be not determined yet, and may be changed according to the input of the user. In the following content, an embodiment of an operation method for a TLC memory device is exemplarily provided.

Figure 7:
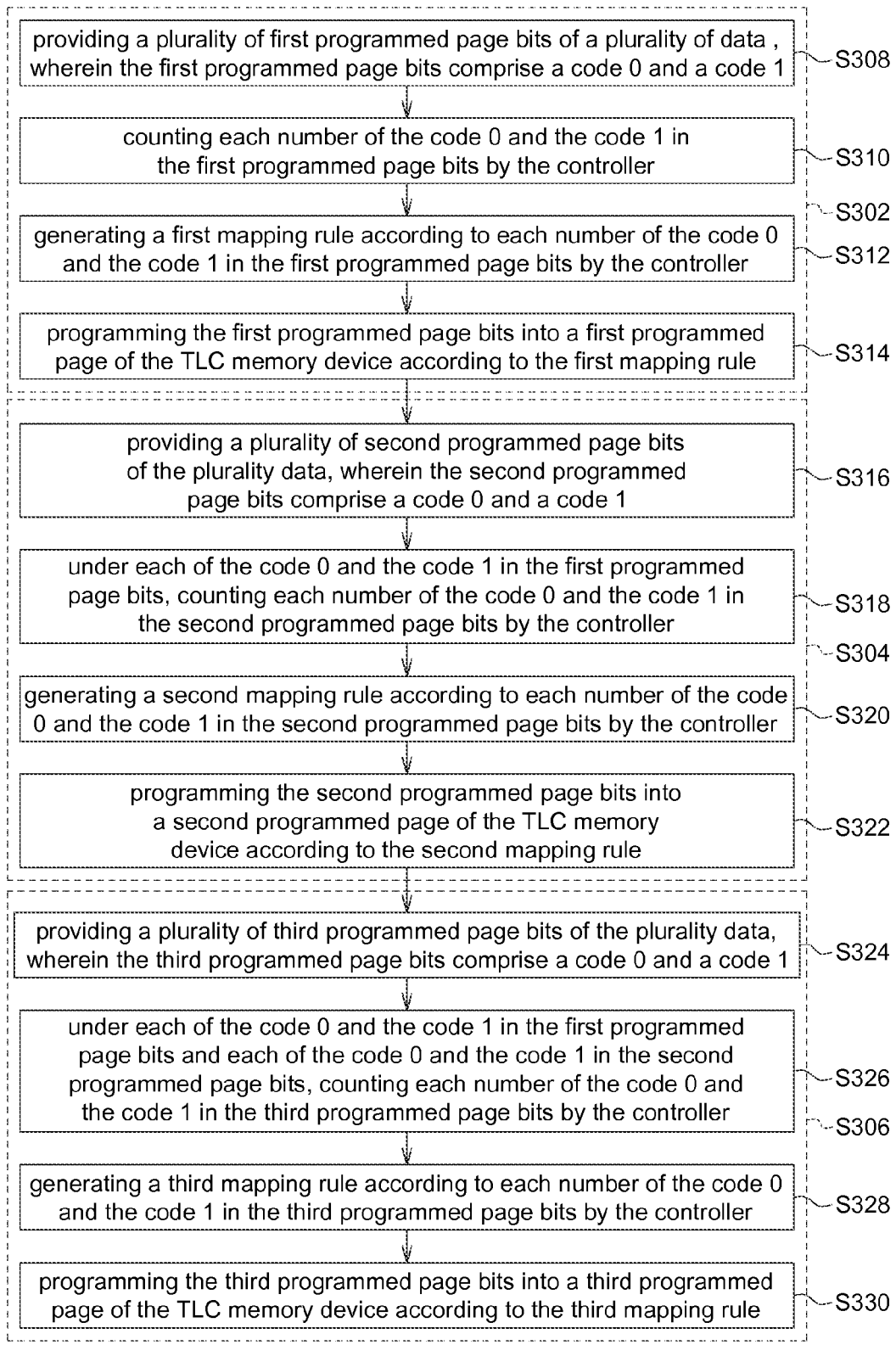
FIG. 7 is a flow chart of a programming process of an operation method for a TLC memory device according to one embodiment.

FIG. 7 is a flow chart of a programming process of the operation method for a TLC memory device according to the embodiment. The programming process comprises a step S302 for programming first programmed page bits of a plurality data into a first programmed page of the TLC memory device, a step S304 for programming second programmed page bits of the data into a second programmed page of the TLC memory device, and a step S306 for programming third programmed page bits of the data into a third programmed page of the TLC memory device.

At step S302, firstly, a plurality of first programmed page bits of a plurality of data are provided, as in step S308. The first programmed page bits comprise a code 0 and a code 1. At step S310, each number of the code 0 and the code 1 in the first programmed page bits is counted by the controller. At step S312, a first mapping rule is generated according to each number of the code 0 and the code 1 in the first programmed page bits by the controller. Then, at step S314, the first programmed page bits are programmed into a first programmed page of the TLC memory device according to the first mapping rule.

At step S304, firstly, a plurality of second programmed page bits of the plurality data are provided, as in step S316. The second programmed page bits comprise a code 0 and a code 1. At step S318, under each of the code 0 and the code 1 in the first programmed page bits, each number of the code 0 and the code 1 in the second programmed page bits is counted by the controller. At step S320, A second mapping rule is generated according to each number of the code 0 and the code 1 in the second programmed page bits by the controller. Then, at step S322, the second programmed page bits are programmed into a second programmed page of the TLC memory device according to the second mapping rule.

At step S306, firstly, a plurality of third programmed page bits of the plurality data are provided, as in step S324. The third programmed page bits comprise a code 0 and a code 1. At step S326, under each of the code 0 and the code 1 in the first programmed page bits and each of the code 0 and the code 1 in the second programmed page bits, each number of the code 0 and the code 1 in the third programmed page bits is counted by the controller. At step S328, A third mapping rule is generated according to each number of the code 0 and the code 1 in the third programmed page bits by the controller. Then, at step S330, the third programmed page bits are programmed into a third programmed page of the TLC memory device according to the third mapping rule.

An example of the programming process of the operation method for the TLC memory device according to this embodiment is given, as illustrated in FIG. 8A-FIG. 8F. In this example, sixteen data are provided to be programmed. In the default mapping rule, the first verifying voltage level corresponds to the code 011, the second verifying voltage level corresponds to the code 010, the third verifying voltage level corresponds to the code 000, the fourth verifying voltage level corresponds to the code 001, the fifth verifying voltage level corresponds to the code 101, the sixth verifying voltage level corresponds to the code 100, the seventh verifying voltage level corresponds to the code 110, and the eighth verifying voltage level corresponds to the code 111.

Figure 8A:
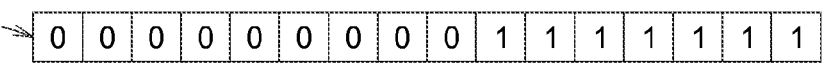
FIG. 8A-FIG. 8F schematically illustrate a programming process of an operation method for a TLC memory device.
Figure 8B:
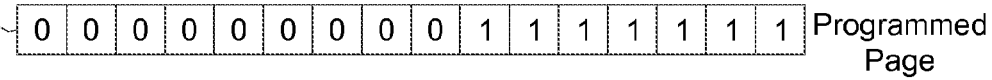

Referring to FIG. 8A, the first programmed page bits 352 of the data to be programmed are provided at first. The first programmed page bits 352 to be programmed comprise codes 0 and 1. The number of the code 0 and the code 1 are counted. The result is that there are nine codes 0 and seven codes 1. Since the number of the code 0 is more than the number of the code 1, they are not needed to be converted. Then, the code 0 is mapped to a first verifying voltage level (EV), and the code 1 is mapped to a fifth verifying voltage level (PV4). The programmed first programmed page bits 354 are shown in FIG. 8B.

Figure 8C:
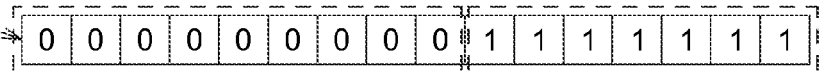
Figure 8C:
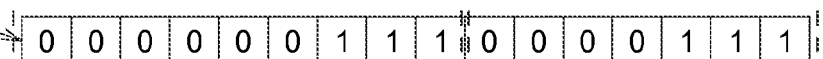
Figure 8D:
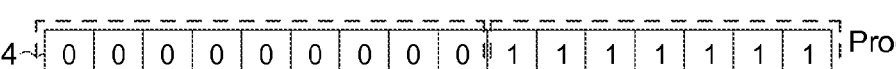
Figure 8D:

Referring to FIG. 8C, the second programmed page bits 356 to be programmed are provided. The second programmed page bits 356 to be programmed comprise codes 0 and 1. The second programmed page bits 356 to be programmed are dived into two groups A1 and A2 according to the corresponding first programmed page bits 354. The number of the code 0 and the code 1 of the second programmed page bits of the first group A1 are counted. The result is that there are six codes 0 and three codes 1. Since the number of the code 0 is more than the number of the code 1, the code 0 and the code 1 are converted The converted code 01 remains at the first verifying voltage level (EV), and the converted code 00 is mapped to a third verifying voltage level (PV2). The number of the code 0 and the code 1 of the second group A2 are counted. The result is that there are four codes 0 and three codes 1. Since the number of the code 0 is more than the number of the code 1, the code 0 and the code 1 of the second group A2 are not needed to be converted. The code 10 remains at the fifth verifying voltage level (PV4), and the code 11 is mapped to a seventh verifying voltage level (PV6). The programmed second programmed page bits 358 are shown in FIG. 8D.

Figure 8E:
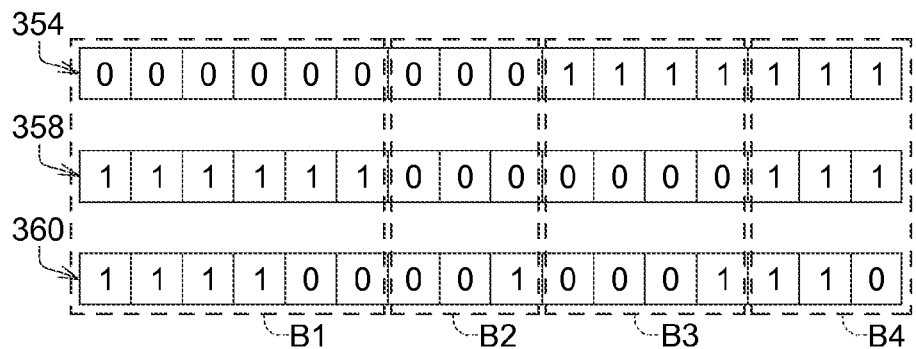
Figure 8F:
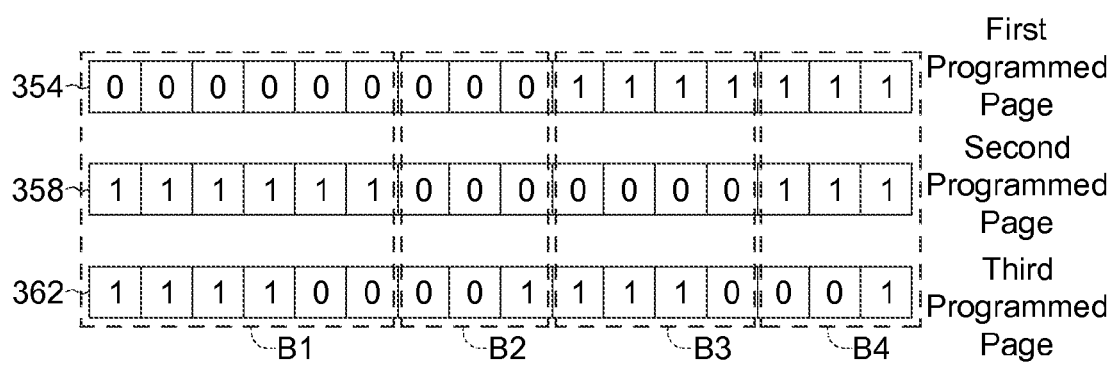

Referring to FIG. 8E, the third programmed page bits 360 to be programmed are provided. The third programmed page bits 360 to be programmed comprise codes 0 and 1. The third programmed page bits 360 to be programmed are dived into four groups B1, B2, B3 and B4 according to the corresponding first programmed page bits 354 and the corresponding second programmed page bits 358. The number of the code 0 and the code 1 of the third programmed page bits of the first group B1 are counted. The result is that there are four codes 1 and two codes 0. Since the number of the code 1 is more than the number of the code 0, they are not needed to be converted. The code 001 remains at the first verifying voltage level (EV), and the code 000 is mapped to a second verifying voltage level (PV1). The number of the code 0 and the code 1 of the first group B2 are counted. The result is that there are two codes 0 and one code 1. Since the number of the code 0 is more than the number of the code 1, they are not needed to be converted. The code 010 remains at the third verifying voltage level (PV2), and the code 011 is mapped to a fourth verifying voltage level (PV3). The number of the code 0 and the code 1 of the third group B3 are counted. The result is that there are three codes 0 and one code 1. Since the number of the code 0 is more than the number of the code 1, the code 0 and the code 1 of the third group B3 are converted. The converted code 101 remains at the fifth verifying voltage level (PV4), and the converted code 100 is mapped to a sixth verifying voltage level (PV5). The number of the code 0 and the code 1 of the fourth group B4 are counted. The result is that there are two codes 1 and one code 0. Since the number of the code 1 is more than the number of the code 0, the code 1 and the code 0 of the fourth group B4 are converted. The converted code 110 remains at the seventh verifying voltage level (PV6), and the converted code 111 is mapped to an eighth verifying voltage level (PV7). The programmed third programmed page bits 362 are shown in FIG. 8D.

The mapping rule may be stored in the TLC memory device or an external memory. One bit is needed for the mapping rule for the first programmed page, two bits are needed for the mapping rule for the second programmed page, and four bits are needed for the mapping rule for the third programmed page. In total, only one byte is used.

Figure 9:
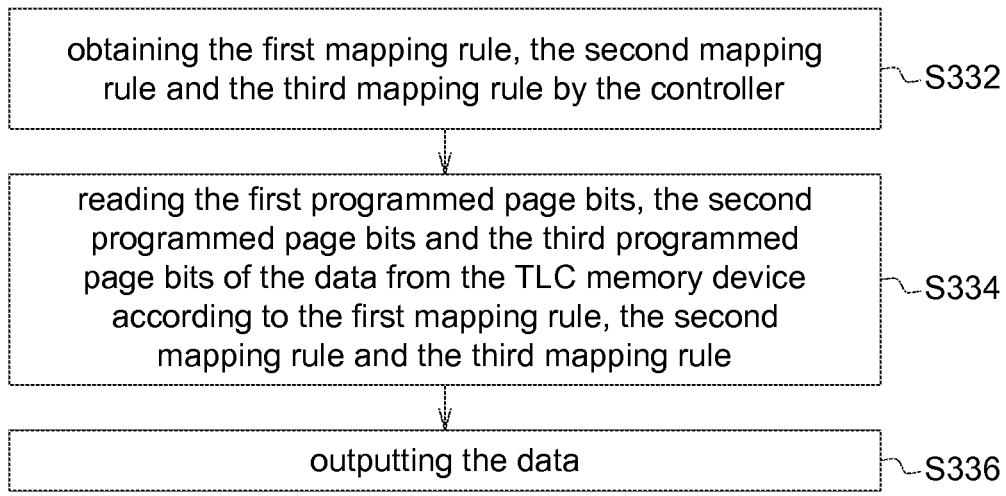
FIG. 9 is a flow chart of a read process of an operation method for a TLC memory device according to one embodiment.

FIG. 9 is a flow chart of a read process of the operation method for the TLC memory device according to the embodiment. At step S332, the first mapping rule, the second mapping rule and the third mapping rule are obtained by the controller. At step S334, the first programmed page bits, the second programmed page bits and the third programmed page bits of the data are read from the TLC memory device according to the first mapping rule, the second mapping rule and the third mapping rule. After that, at step S336, the data are outputted. In some example, only the first programmed page bits, the second programmed page bits, or the third programmed page bits are needed. At this time, only the corresponding first mapping rule, second mapping rule or third mapping rule are obtained by the controller, and only the bits needed are read according to the corresponding mapping rule.

In the embodiments described above, because the mapping of the memory cells, the possibility of programming the slow cells to a state of higher threshold voltage (such as the fourth verifying voltage level or the eighth verifying voltage level) is decreased. As such, the program disturbance caused by the slow cells is reduced. Further, the disturbance caused by the pass voltage $V_{pass}$ may also be reduced. The operation methods according to the embodiments described above may be used in a flash memory device. While the above embodiments are focused on the MLC and TLC memory devices, other memory devices, such as quad-level-cell (QLC) memory devices, may apply similar operation methods. Alternatively, these operation methods may be used in an emerging memory device, such as a PRAM or a PCM.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An operation method for a memory device, comprising:
   programming the memory device, comprising:
   providing a plurality of data to a controller, the data comprising a plurality of codes;
   counting each number of the codes by the controller;
   generating a mapping rule according to each number of the codes, wherein in the mapping rule, each of the codes is mapped to one of a plurality of verifying voltage levels which are sequentially arranged from low to high; and
   programming the data into a memory array of the memory device according to the mapping rule.

2. The operation method according to claim 1, wherein the codes comprise a first code, a second code, a third code and a fourth code, and the first code, the second code, the third code and the fourth code are two bits, and wherein in the mapping rule, each of the first code, the second code, the third code and the fourth code is mapped to one of a first verifying voltage level, a second verifying voltage level, a third verifying voltage level and a fourth verifying voltage level which are sequentially arranged from low to high.

3. The operation method according to claim 2, wherein in the mapping rule, one of the first code, the second code, the third code and the fourth code whose number is largest is mapped to the first verifying voltage level.

4. The operation method according to claim 2, wherein in the mapping rule, one of the first code, the second code, the third code and the fourth code whose number is largest is mapped to the second verifying voltage level.

5. The operation method according to claim 1, wherein the codes comprise a first code, a second code, a third code, a fourth code, a fifth code, a sixth code, a seventh code and an eighth code, and the first code, the second code, the third code, the fourth code, the fifth code, the sixth code, the seventh code and the eighth code are three bits, and wherein in the mapping rule, each of the first code, the second code, the third code, the fourth code, the fifth code, the sixth code, the seventh code and the eighth code is mapped to one of a first verifying voltage level, a second verifying voltage level, a third verifying voltage level, a fourth verifying voltage level, a fifth verifying voltage level, a sixth verifying voltage level, a seventh verifying voltage level and an eighth verifying voltage level which are sequentially arranged from low to high.

6. The operation method according to claim 1, further comprising:
   reading the memory device, comprising:
   obtaining the mapping rule by the controller;
   reading the data from the memory array of the memory device according to the mapping rule, wherein in the mapping rule, each of the verifying voltage levels which are sequentially arranged from low to high is mapped to one of the codes; and
   outputting the data.

7. An operation method for a memory device, comprising:
   programming the memory device, comprising:
   providing a plurality of first programmed page bits of a plurality of data, wherein the first programmed page bits comprise a code 0 and a code 1;
   counting each number of the code 0 and the code 1 in the first programmed page bits by a controller;
   generating a first mapping rule according to each number of the code 0 and the code 1 in the first programmed page bits by the controller;
   programming the first programmed page bits into a first programmed page of the memory device according to the first mapping rule;
   providing a plurality of second programmed page bits of the plurality data, wherein the second programmed page bits comprise a code 0 and a code 1;
   under each of the code 0 and the code 1 in the first programmed page bits, counting each number of the code 0 and the code 1 in the second programmed page bits by the controller;
   generating a second mapping rule according to each number of the code 0 and the code 1 in the second programmed page bits by the controller;
   programming the second programmed page bits into a second programmed page of the memory device according to the second mapping rule;
   providing a plurality of third programmed page bits of the plurality data, wherein the third programmed page bits comprise a code 0 and a code 1;
   under each of the code 0 and the code 1 in the first programmed page bits and each of the code 0 and the code 1 in the second programmed page bits, counting each number of the code 0 and the code 1 in the third programmed page bits by the controller;
   generating a third mapping rule according to each number of the code 0 and the code 1 in the third programmed page bits by the controller; and
   programming the third programmed page bits into a third programmed page of the memory device according to the third mapping rule.

8. The operation method according to claim 7, further comprising:
   reading the memory device, comprising:
   obtaining the first mapping rule, the second mapping rule and the third mapping rule by the controller;
   reading the first programmed page bits, the second programmed page bits and the third programmed page bits of the data from the memory device according to the first mapping rule, the second mapping rule and the third mapping rule; and
   outputting the data.

9. The operation method according to claim 7, further comprising:
   reading the memory device, comprising:
   obtaining the first mapping rule by the controller;
   reading the first programmed page bits of the data from the memory device according to the first mapping rule; and
   outputting the first programmed page bits of the data.

10. The operation method according to claim 7, further comprising:
    reading the memory device, comprising:
    obtaining the second mapping rule by the controller;
    reading the second programmed page bits of the data from the memory device according to the second mapping rule; and
    outputting the second programmed page bits of the data.

11. The operation method according to claim 7, further comprising:
    reading the memory device, comprising:
    obtaining the third mapping rule by the controller;
    reading the third programmed page bits of the data from the memory device according to the third mapping rule; and
    outputting the third programmed page bits of the data.

* * * * *